United States Patent
Kobayashi et al.

(10) Patent No.: US 11,059,753 B2
(45) Date of Patent: *Jul. 13, 2021

(54) ORIENTED ALN SINTERED BODY AND METHOD FOR PRODUCING THE SAME

(71) Applicant: NGK INSULATORS, LTD., Nagoya (JP)

(72) Inventors: Yoshimasa Kobayashi, Nagoya (JP); Hiroharu Kobayashi, Kasugai (JP); Kazuki Iida, Nagoya (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/420,334

(22) Filed: May 23, 2019

(65) Prior Publication Data

US 2019/0276369 A1 Sep. 12, 2019

Related U.S. Application Data

(63) Continuation of application No. PCT/JP2017/045764, filed on Dec. 20, 2017.

(30) Foreign Application Priority Data

Dec. 21, 2016 (JP) .............................. JP2016-247873
Jul. 10, 2017 (WO) .................. PCT/JP2017/025084

(51) Int. Cl.
*C04B 35/581* (2006.01)
*C04B 35/645* (2006.01)

(52) U.S. Cl.
CPC .......... *C04B 35/581* (2013.01); *C04B 35/645* (2013.01); *C04B 2235/3217* (2013.01); *C04B 2235/3865* (2013.01); *C04B 2235/528* (2013.01); *C04B 2235/5292* (2013.01); *C04B 2235/5296* (2013.01); *C04B 2235/5436* (2013.01)

(58) Field of Classification Search
CPC .................................................. C04B 35/581
See application file for complete search history.

(56) References Cited

U.S. PATENT DOCUMENTS

| | | | |
|---|---|---|---|
| 4,847,221 A | 7/1989 | Horiguchi et al. | |
| 7,081,425 B2* | 7/2006 | Kanechika | C04B 35/581 |
| | | | 501/98.4 |
| 8,703,041 B2* | 4/2014 | Kaito | C04B 41/009 |
| | | | 264/668 |
| 2010/0183860 A1 | 7/2010 | Kaito et al. | |
| 2012/0114905 A1 | 5/2012 | Engler et al. | |
| 2015/0353355 A1 | 12/2015 | Fukunaga et al. | |
| 2020/0010374 A1* | 1/2020 | Kobayashi | C04B 35/581 |

FOREIGN PATENT DOCUMENTS

| | | |
|---|---|---|
| CN | 101100386 A | 1/2008 |
| CN | 103249695 A | 8/2013 |
| CN | 104955769 A | 9/2015 |
| EP | 0 615 952 A2 | 9/1994 |
| EP | 0 669 412 A1 | 8/1995 |
| EP | 2 955 156 A1 | 12/2015 |
| JP | S63-134569 A1 | 6/1988 |
| JP | S63-206360 A1 | 8/1988 |
| JP | H07-315915 A | 12/1995 |
| JP | 2010-138056 A1 | 6/2010 |
| WO | 2009/031510 A1 | 3/2009 |
| WO | 2012/002545 A1 | 1/2012 |
| WO | 2014/123247 A1 | 8/2014 |

OTHER PUBLICATIONS

Extended European Search Report (Application No. 17884131.8) dated May 12, 2020.
U.S. Appl. No. 16/419,313, filed May 22, 2019, Kobayashi, et al.
English translation of International Preliminary Report on Patentability (Chapter I) (Application No. PCT/JP2017/045764) dated Jul. 4, 2019.
Proceedings of the 29th Fall Meeting, issued by The Ceramic Society of Japan, 2016, Program No. 3B17.
International Search Report and Written Opinion (Application No. PCT/JP2017/045764) dated Jan. 30, 2018.
Chinese Office Action, Chinese Application No. 201780073408.3 dated May 6, 2021 (7 pages).

* cited by examiner

*Primary Examiner* — Karl E Group
(74) *Attorney, Agent, or Firm* — Burr & Brown, PLLC

(57) ABSTRACT

A method for producing an oriented AlN sintered body includes a first step of preparing a formed body by forming a mixture obtained by mixing a sintering aid with an AlN raw-material powder containing a plate-like AlN powder whose plate surface is a c-plane and which has an aspect ratio of 3 or more and an average thickness of 0.05 to 1.8 μm, wherein the mixture is formed such that the plate surface of the plate-like AlN powder is disposed along a surface of the formed body; and a second step of obtaining an oriented AlN sintered body by subjecting the formed body to hot-press sintering in a non-oxidizing atmosphere while applying a pressure to the surface of the formed body.

10 Claims, 3 Drawing Sheets

Single particle

Agglomerated particle

Fine particle   Single particle

ORIENTED AlN SINTERED BODY AND METHOD FOR PRODUCING THE SAME

BACKGROUND OF THE INVENTION

1. Field of the Invention

The present invention relates to an oriented AlN sintered body and a method for producing the same.

2. Description of the Related Art

Aluminum nitride is a material having various good properties. For example, aluminum nitride is known to have good plasma resistance and thermal conductivity and is used as a material of an electrostatic chuck and a ceramic heater. Regarding piezoelectric properties, it is also known that, among piezoelectric substances, aluminum nitride exhibits a very high use-limit temperature of 1,200° C., exhibits piezoelectricity which is several times the piezoelectricity of quartz crystal, and has a high modulus of elasticity and maintains the linearity of piezoelectricity even for high pressures. NPL 1 has reported that enhancement of the c-axis orientation of aluminum nitride improves thermal conductivity. In NPL 1, a slurry prepared by adding, as a sintering aid, $CaF_2$ to an aluminum nitride powder is formed in a rotating magnetic field, and the resulting formed body is subjected to spark plasma sintering to obtain an aluminum nitride sintered body having a high c-axis orientation.

CITATION LIST

Non Patent Literature

NPL 1: Proceedings of the 29th Fall Meeting, issued by The Ceramic Society of Japan, 2016, Program number: 3B17

SUMMARY OF THE INVENTION

However, in NPL 1, it is difficult to produce an aluminum nitride sintered body having a high c-axis orientation at a low cost because a rotating magnetic field is used. Furthermore, in NPL 1, the c-axis orientation determined by using Lotgering is about 0.7, and thus the sintered body is not considered to have sufficient orientation.

The present invention has been made in order to solve the problems described above, and a main object of the present invention is to provide an AlN sintered body having a high degree of c-plane orientation at a relatively low cost.

A method for producing an oriented AlN sintered body according to the present invention includes a first step of preparing a formed body by forming a mixture obtained by mixing a sintering aid with an AlN raw-material powder containing a plate-like AlN powder whose plate surface is a c-plane and which has an aspect ratio of 3 or more and an average thickness of 0.05 to 1.8 μm, wherein the mixture is formed such that the plate surface of the plate-like AlN powder is disposed along a surface of the formed body, and a second step of obtaining an oriented AlN sintered body by subjecting the formed body to hot-press sintering in a non-oxidizing atmosphere while applying a pressure to the surface of the formed body.

In the method for producing an oriented AlN sintered body, a formed body is formed such that a plate surface (c-plane) of a plate-like AlN powder is disposed along a surface of the formed body. This formed body contains a sintering aid. In hot-press sintering of the formed body, the formed body is subjected to hot-press sintering in a non-oxidizing atmosphere while applying a pressure to the surface of the formed body, that is, while applying a pressure to the formed body from a direction substantially perpendicular to the surface of the formed body. Consequently, sintering of an AlN raw-material powder containing the plate-like AlN powder is promoted by the sintering aid. Furthermore, since the plate surface (c-plane) of the plate-like AlN powder is arranged along the surface of the formed body, the sintering proceeds while the plate-like AlN powder functions as a template. As a result, an oriented AlN sintered body having a high degree of c-plane orientation is obtained. Since this production method uses hot-press sintering without using a rotating magnetic field, the cost can be suppressed to be low compared with the case where a rotating magnetic field is used.

An oriented AlN sintered body according to the present invention is an oriented AlN sintered body having a polycrystalline structure, in which a grain boundary phase that contains a component derived from a sintering aid is present between AlN sintered grains, a degree of c-plane orientation is 70% or more as determined by a Lotgering method, and a relative density is 98.6% or more.

This oriented AlN sintered body has a high degree of c-plane orientation and thus has good plasma resistance and piezoelectric properties. Such an oriented AlN sintered body can be suitably produced by the above method for producing an oriented AlN sintered body.

DETAILED DESCRIPTION OF THE INVENTION

Figure 1A:
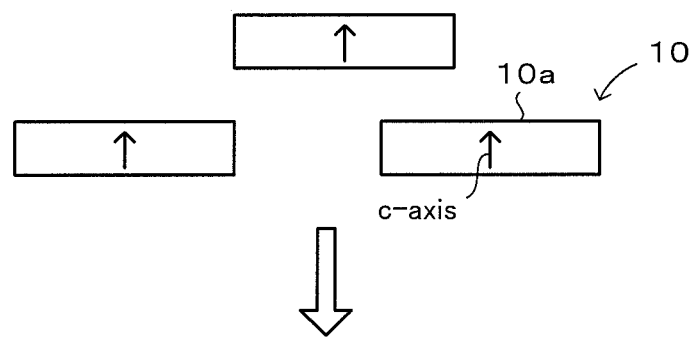
FIGS. 1A to 1C include explanatory views illustrating an example of steps of producing an AlN sintered body by a TGG method.

A preferred embodiment of the present invention will be described below.

A method for producing an oriented AlN sintered body according to the present embodiment includes a first step of preparing a formed body by forming a mixture obtained by mixing a sintering aid with an AlN raw-material powder containing a plate-like AlN powder whose plate surface is a c-plane, in which the mixture is formed such that the plate surface of the plate-like AlN powder is disposed along a surface of the formed body, and a second step of obtaining an oriented AlN sintered body by subjecting the formed body to hot-press sintering in a non-oxidizing atmosphere while applying a pressure to the surface of the formed body.

The plate-like AlN powder is an AlN powder whose plate surface is a c-plane. The plate-like AlN powder preferably has an aspect ratio of 3 or more. The aspect ratio refers to average particle size/average thickness. Herein, the average particle size is an average of the length of the plate surface in a long-axis direction, and the average thickness is an average of a short-axis length of a particle. The use of the AlN raw-material powder that contains a plate-like AlN powder having an aspect ratio of 3 or more increases the degree of c-plane orientation of an AlN sintered body that is finally obtained. The aspect ratio is preferably 5 or more. The average particle size of the plate-like AlN powder is preferably large from the viewpoint of achieving high orientation, and the average particle size is preferably 2 μm or more, preferably 5 μm or more, and more preferably 7 μm or more. However, the average particle size of the plate-like AlN powder is preferably small from the viewpoint of densification, and the average particle size is preferably 20 μm or less and more preferably 10 μm or less. In view of the above, the average particle size is preferably 2 to 20 μm in order to realize both high orientation and densification. From the viewpoint of the ease of preparation of the plate-like AlN powder, the average thickness is preferably 0.05 μm or more, preferably 0.07 μm or more, more preferably 0.1 μm or more, more preferably 0.3 μm or more, more preferably 0.5 μm or more, and still more preferably 0.8 μm or more. On the other hand, from the viewpoint of the ease of orientation of the plate-like AlN powder, the average thickness is preferably 1.8 μm or less, more preferably 1.5 μm or less, more preferably 1 μm or less, and still more preferably 0.5 μm or less. In the case where the plate-like AlN powder has an excessively large average thickness, for example, when the thickness of a formed body before sintering is adjusted by using a doctor blade or the like, a ratio of a shear stress that is received by side surfaces (surfaces parallel to the thickness direction) of plate-like AlN particles relative to a total shear stress applied from the blade to the particles increases, and consequently, the orientation of the plate-like AlN particles may be disordered. In view of this, the average thickness is preferably 0.05 to 1.8 μm in order to realize both the ease of preparation and the ease of orientation of the plate-like AlN powder.

Preferably, the particles constituting the plate-like AlN powder do not agglomerate, are separated from each other, and are each present in the form of a single particle. In order to cause the particles constituting the plate-like AlN powder to be present in the form of a single particle, at least one treatment of a classification treatment, a disintegration treatment, and an elutriation treatment is employed. An example of the classification treatment is air-stream classification. Examples of the disintegration treatment include pot disintegration and wet-type atomization. The elutriation treatment is preferably employed when fine particles are mixed. Whether or not particles constituting the plate-like AlN powder are present in the form of a single particle can be determined on the basis of an image obtained with a wet flow-type particle size/shape analyzer (model number: FPIA-3000S, available from Sysmex Corporation). A plate-like AlN powder having a high purity is preferably used. The purity of the plate-like AlN powder is preferably 98% by mass or more and more preferably 99% by mass or more. In particular, a metal impurity concentration (concentration of metals other than Al) is preferably 50 ppm by mass or less, and an oxygen concentration is preferably 1% by mass or less and particularly preferably 0.8% by mass or less. However, a component that is the same as the sintering aid or impurities that volatilize and disappear during sintering may be contained.

The AlN raw-material powder may be the plate-like AlN powder itself. Alternatively, the AlN raw-material powder may be a mixed AlN powder in which a plate-like AlN powder and a spherical AlN powder are mixed. The average particle size of the spherical AlN powder is preferably smaller than the average particle size of the plate-like AlN powder and is preferably 1.5 μm or less. When such a mixed AlN powder is used as the AlN raw-material powder, during sintering, the plate-like AlN powder is formed into a seed crystal (template), the spherical AlN powder is formed into a matrix, and the template is homoepitaxially grown while incorporating the matrix. This production method is referred to as a templated grain growth (TGG) method. The mass ratio of the plate-like AlN powder to the spherical AlN powder is appropriately determined in consideration of the aspect ratio and the average particle size of the plate-like AlN powder. For example, with an increase in the average particle size of the plate-like AlN powder, the mass ratio of the plate-like AlN powder to the spherical AlN powder may be decreased.

The sintering aid has a function of promoting sintering of AlN. Since AlN is less likely to sinter compared with alumina and the like, it is preferable to add such a sintering aid and to perform hot-press sintering. As the sintering aid, a complex oxide of Ca and Al or a rare-earth oxide such as yttria is preferably used. This is because these oxides have plasma resistance that is substantially the same as AlN and thus do not adversely affect plasma resistance even if the oxides remain in the oriented AlN sintered body. Examples of the complex oxide of Ca and Al include complex oxides that contain CaO and $Al_2O_3$ in appropriate ratios, such as C2A, C3A, and C4A. The sintering aid is preferably used in an amount of 1% to 10% by mass and more preferably 2% to 8% by mass relative to the total mass of the plate-like AlN powder, the spherical AlN powder, and the sintering aid.

In the first step, a formed body is prepared by forming a mixture obtained by mixing a sintering aid with an AlN raw-material powder, in which the mixture is formed such that the plate surface of the plate-like AlN powder is disposed along a surface of the formed body. Consequently, since the c-axis of the plate-like AlN powder is easily arranged in the direction orthogonal to the surface of the formed body, the degree of c-plane orientation of the AlN sintered body improves. Examples of the forming method in this case include, but are not particularly limited to, tape casting, extrusion molding, cast molding, injection molding, and uniaxial pressing. A multilayer formed body may be prepared by stacking a plurality of formed bodies obtained by any of these forming methods.

In the second step, an oriented AlN sintered body is obtained by subjecting the formed body obtained in the first step to hot-press sintering while applying a pressure to the surface of the formed body. Before the hot-press sintering, degreasing may be performed. The atmosphere of the hot-press sintering is preferably a non-oxidizing atmosphere such as a nitrogen atmosphere, an argon atmosphere, or a vacuum. The pressure (surface pressure) of the hot-press sintering is preferably 50 $kgf/cm^2$ or more and preferably 200 $kgf/cm^2$ or more. The temperature (maximum attained temperature) of the hot-press sintering is preferably 1,800° C. to 1,950° C. and more preferably 1,880° C. to 1,920° C. The time of the hot-press sintering is not particularly limited but is appropriately determined in a range of, for example, 2 to 10 hours. The furnace for the hot-press sintering is not particularly limited. For example, a furnace made of graphite can be used.

An oriented AlN sintered body of the present embodiment is a polycrystalline structure in which a grain boundary phase that contains a component derived from a sintering aid is present between AlN sintered grains, and a degree of c-plane orientation is 70% or more as determined by a Lotgering method. This oriented AlN sintered body can be suitably produced by the above method for producing an oriented AlN sintered body. The oriented AlN sintered body has a high degree of c-plane orientation and thus has good plasma resistance and piezoelectric properties. Therefore, the oriented AlN sintered body is useful as a material of members for which plasma resistance is required, such as members for semiconductor manufacturing apparatuses, and a material of members for which high piezoelectric properties are required, such as sensors for high temperatures. In the oriented AlN sintered body of the embodiment, the degree of c-plane orientation is preferably 95% or more and more preferably 97% or more. This is because plasma resistance and piezoelectric properties improve with an increase in the degree of c-plane orientation. Examples of the sintering aid include complex oxides of Ca and Al and rare-earth oxides such as yttria, as described above. When the sintering aid is a complex oxide of Ca and Al, the grain boundary phase contains a Ca component. When the sintering aid is yttria, the grain boundary phase contains a Y component. The relative density of the oriented AlN sintered body of the embodiment is preferably 98.6% or more, preferably 99.1% or more, more preferably 99.8% or more, and still more preferably 100%. This is because plasma resistance improves with an increase in the relative density.

Figure 1B:
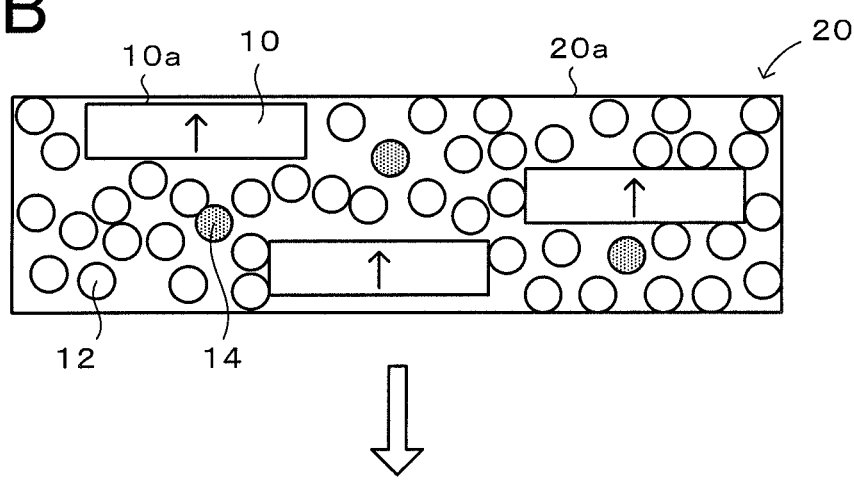
Figure 1C:
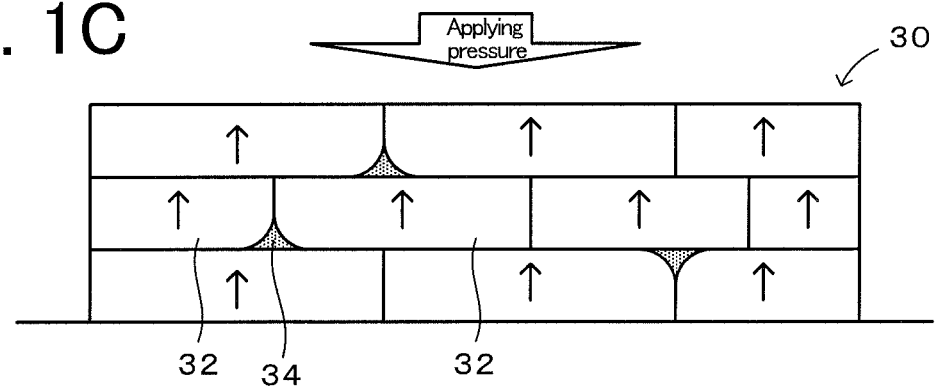

Here, FIGS. 1A to 1C illustrate an example of steps of producing an AlN sintered body by the TGG method. First, a plate-like AlN powder 10 is prepared (refer to FIG. 1A). The plate-like AlN powder 10 has a plate surface 10a which is a c-plane. Next, a formed body 20 is produced by using a mixed AlN powder in which the plate-like AlN powder 10, a spherical AlN powder 12, and a sintering aid 14 are mixed (first step, refer to FIG. 1B). At this time, the formed body 20 is produced such that the plate surface 10a (c-plane) of the plate-like AlN powder 10 is arranged along a surface 20a of the formed body 20. Next, the formed body 20 is subjected to hot-press sintering while applying a pressure from a direction substantially perpendicular to the surface 20a (second step, refer to FIG. 1C). Consequently, the sintering of the plate-like AlN powder 10 and the spherical AlN powder 12 is promoted by the sintering aid 14. Since the plate surface 10a (c-plane) of the plate-like AlN powder 10 is arranged along the surface 20a of the formed body 20, the sintering proceeds while the plate-like AlN powder 10 functions as a template. As a result, an oriented AlN sintered body 30 having a high degree of c-plane orientation is obtained. A grain boundary phase 34 that contains a component derived from the sintering aid 14 is present between AlN sintered grains 32 in the oriented AlN sintered body 30.

EXAMPLES

TABLE 1

| | Composition | | | | | | | Formed body |
| | Usage of | Plate-like AlN powder | | | | Sintering aid | | Plate-like/ | Degree |
| Experimental example | spherical AlN powder (% by mass) | Average particle size (μm) | Average thickness (μm) | Aspect ratio | Usage (% by mass) | Composition | Amount of added (% by mass) | spherical (mass ratio) | of c-plane orientation (%) |
|---|---|---|---|---|---|---|---|---|---|
| 1 | 47.6 | 2 | 0.08 | 25 | 47.6 | C3A | 4.8 | 1.0 | 10 |
| 2 | 28.56 | 2 | 0.08 | 25 | 66.64 | C3A | 4.8 | 2.3 | 14 |
| 3 | 19.04 | 2 | 0.08 | 25 | 76.16 | C3A | 4.8 | 4.0 | 16 |
| 4 | 57.12 | 5 | 0.07 | 70 | 38.08 | C3A | 4.8 | 0.7 | 9 |
| 5 | 47.6 | 5 | 0.07 | 70 | 47.6 | C3A | 4.8 | 1.0 | 12 |
| 6 | 38.08 | 5 | 0.07 | 70 | 57.12 | C3A | 4.8 | 1.5 | 14 |
| 7 | 66.64 | 7 | 0.1 | 70 | 28.56 | C3A | 4.8 | 0.4 | 9 |
| 8 | 57.12 | 7 | 0.1 | 70 | 38.08 | C3A | 4.8 | 0.7 | 12 |
| 9 | 47.6 | 7 | 0.1 | 70 | 47.6 | C3A | 4.8 | 1.0 | 15 |
| 10 | 19.04 | 2 | 0.08 | 25 | 76.16 | C4A | 4.8 | 4.0 | 16 |
| 11 | 19.04 | 2 | 0.08 | 25 | 76.16 | C2A | 4.8 | 4.0 | 16 |
| 12 | 19.52 | 2 | 0.08 | 25 | 78.08 | C3A | 2.4 | 4.0 | 17 |
| 13 | 18.56 | 2 | 0.08 | 25 | 74.24 | C3A | 7.2 | 4.0 | 15 |
| 14 | 19.04 | 2 | 0.08 | 25 | 76.16 | C3A | 4.8 | 4.0 | 16 |
| 15 | 19.04 | 2 | 0.08 | 25 | 76.16 | C3A | 4.8 | 4.0 | 16 |
| 16 | 83.52 | 2 | 0.08 | 25 | 9.28 | C3A | 4.8 | 0.1 | 4 |

| | | | | AlN sintered body | | | | |
| | Sintering condition | | | | Amount | | | |
| Experimental example | Maximum temperature (° C.) | Holding time (h) | ※1 Sintering method | Metal impurity concentration (ppm) | of Oxygen (ppm) | Relative density (%) | Degree of c-plane orientation (%) | Corrosion resistance |
|---|---|---|---|---|---|---|---|---|
| 1 | 1850 | 5 | HP | 20900 | 16400 | 100 | 70 | B |
| 2 | 1850 | 5 | HP | 20600 | 16200 | 99.9 | 98 | A |
| 3 | 1850 | 5 | HP | 20700 | 16300 | 99.9 | 100 | A |
| 4 | 1850 | 5 | HP | 20800 | 16300 | 99.7 | 76 | B |
| 5 | 1850 | 5 | HP | 20900 | 16200 | 100 | 97 | A |
| 6 | 1850 | 5 | HP | 20800 | 16300 | 100 | 100 | A |
| 7 | 1850 | 5 | HP | 20700 | 16400 | 99.5 | 73 | B |
| 8 | 1900 | 5 | HP | 11000 | 9300 | 99.5 | 97 | A |
| 9 | 1900 | 5 | HP | 11400 | 9700 | 99.4 | 100 | A |
| 10 | 1850 | 5 | HP | 22800 | 15700 | 100 | 100 | A |
| 11 | 1850 | 5 | HP | 17200 | 17900 | 99.6 | 100 | A |
| 12 | 1850 | 5 | HP | 10600 | 8500 | 99.1 | 100 | A |

TABLE 1-continued

| | | | | | | | | |
|---|---|---|---|---|---|---|---|---|
| 13 | 1850 | 5 | HP | 30200 | 24600 | 99.6 | 98 | A |
| 14 | 1800 | 10 | HP | 21100 | 17100 | 99.3 | 99 | A |
| 15 | 1900 | 2 | HP | 11200 | 9200 | 100 | 100 | A |
| 16 | 1880 | 5 | Normal Pressure | 17600 | 18000 | 99 | 44 | D |

※1) HP stands for hot-press.

TABLE 2

| | Composition | | | | | | | |
|---|---|---|---|---|---|---|---|---|
| | Usage of spherical AlN powder | Plate-like AlN powder | | | | Sintering aid | | Plate-like/ spherical |
| Experimental example | (% by mass) | Average particle size (μm) | Average thickness (μm) | Aspect ratio | Usage (% by mass) | Composition | Amount of added (% by mass) | (mass ratio) |
| 17 | 0 | 10 | 0.33 | 30 | 95.2 | C3A | 4.8 | — |
| 18 | 0 | 18 | 0.33 | 55 | 95.2 | C3A | 4.8 | — |
| 19 | 4.8 | 28 | 7 | 4 | 90.4 | C3A | 4.8 | 18.8 |
| 20 | 47.6 | 28 | 7 | 4 | 47.6 | C3A | 4.8 | 1.0 |
| 21 | 66.64 | 28 | 7 | 4 | 28.56 | C3A | 4.8 | 0.4 |
| 22 | 47.6 | 1.2 | 1 | 1 | 47.6 | C3A | 4.8 | 1.0 |
| 23 | 47.6 | 3 | 1 | 3 | 47.6 | C3A | 4.8 | 1.0 |
| 24 | 47.6 | 3 | 1.5 | 2 | 47.6 | C3A | 4.8 | 1.0 |
| 25 | 47.6 | 10 | 0.33 | 30 | 47.6 | C3A | 4.8 | 1.0 |
| 26 | 47.6 | 10 | 0.5 | 20 | 47.6 | C3A | 4.8 | 1.0 |
| 27 | 47.6 | 10 | 1 | 10 | 47.6 | C3A | 4.8 | 1.0 |
| 28 | 47.6 | 10 | 1.8 | 6 | 47.6 | C3A | 4.8 | 1.0 |
| 29 | 47.6 | 10 | 2 | 5 | 47.6 | C3A | 4.8 | 1.0 |
| 30 | 47.6 | 18 | 1.8 | 10 | 47.6 | C3A | 4.8 | 1.0 |
| 31 | 47.6 | 15 | 1.5 | 10 | 47.6 | C3A | 4.8 | 1.0 |
| (27 | 47.6 | 10 | 1 | 10 | 47.6 | C3A | 4.8 | 1.0 |
| 32 | 47.6 | 5 | 0.5 | 10 | 47.6 | C3A | 4.8 | 1.0 |
| 33 | 47.6 | 1.2 | 0.12 | 10 | 47.6 | C3A | 4.8 | 1.0 |
| 34 | 47.6 | 5 | 0.33 | 15 | 47.6 | C3A | 4.8 | 1.0 |
| (25 | 47.6 | 10 | 0.33 | 30 | 47.6 | C3A | 4.8 | 1.0 |
| 35 | 47.6 | 18 | 0.33 | 55 | 47.6 | C3A | 4.8 | 1.0 |
| 36 | 47.6 | 21 | 0.33 | 64 | 47.6 | C3A | 4.8 | 1.0 |

| | Formed body | Sintering condition | | | AIN sintered body | | | | |
|---|---|---|---|---|---|---|---|---|---|
| Experimental example | Degree of c-plane orientation (%) | Maximum temperature (° C.) | Holding time (h) | ※1 Sintering method | Metal impurity concentration (ppm) | Amount of Oxygen (ppm) | Relative density (%) | Degree of c-plane orientation (%) | Corrosion resistance |
| 17 | 45 | 1900 | 10 | HP | 12000 | 11000 | 100 | 100 | A |
| 18 | 56 | 1900 | 10 | HP | 12000 | 11000 | 100 | 100 | A |
| 19 | 10 | 1900 | 10 | HP | 12500 | 11500 | 96.0 | 92 | D |
| 20 | 6 | 1900 | 10 | HP | 12400 | 11600 | 98.0 | 68 | D |
| 21 | 3 | 1900 | 10 | HP | 12600 | 11300 | 99.0 | 45 | D |
| 22 | 2 | 1900 | 10 | HP | 11800 | 11500 | 100 | 10 | D |
| 23 | 6 | 1900 | 10 | HP | 12100 | 11500 | 100 | 71 | B |
| 24 | 4 | 1900 | 10 | HP | 12000 | 11500 | 100 | 40 | D |
| 25 | 20 | 1900 | 10 | HP | 11400 | 10000 | 100 | 100 | A |
| 26 | 18 | 1900 | 10 | HP | 12100 | 11600 | 100 | 99 | A |
| 27 | 17 | 1900 | 10 | HP | 12200 | 11700 | 100 | 98 | A |
| 28 | 15 | 1900 | 10 | HP | 11900 | 11500 | 99.2 | 96 | A |
| 29 | 10 | 1900 | 10 | HP | 12000 | 11400 | 98.5 | 95 | D |
| 30 | 15 | 1900 | 10 | HP | 11400 | 10000 | 99.2 | 95 | A |
| 31 | 14 | 1900 | 10 | HP | 11600 | 10000 | 99.2 | 95 | A |
| (27 | 17 | 1900 | 10 | HP | 12200 | 11700 | 100 | 98 | A) |
| 32 | 14 | 1900 | 10 | HP | 11400 | 10000 | 100 | 96 | A |
| 33 | 5 | 1900 | 10 | HP | 12300 | 11700 | 100 | 80 | B |
| 34 | 14 | 1900 | 10 | HP | 11400 | 10000 | 100 | 100 | A |
| (25 | 20 | 1900 | 10 | HP | 11400 | 10000 | 100 | 100 | A) |
| 35 | 30 | 1900 | 10 | HP | 11400 | 10000 | 100 | 100 | A |
| 36 | 35 | 1900 | 10 | HP | 12300 | 11700 | 98.8 | 100 | C |

※1) HP stands for hot-press.

Experimental Examples 1 to 36

1. Method for Producing Highly Oriented AlN Sintered Body (1) Synthesis of Plate-Like AlN Powder One hundred grams of a plate-like alumina (available from Kinsei Matec Co., Ltd.), 50 g of carbon black (Mitsubishi Chemical Corporation), 1,000 g of 02 mm alumina balls, and 350 mL of IPA (TOKUSO IPA, available from Tokuyama Corporation) were each weighed and put in a poly-pot container, and pulverization and mixing were conducted at 30 rpm for 240 minutes. A plate-like alumina having an average particle size of 2 μm, 5 μm, or 7 μm was used as the plate-like alumina. The plate-like alumina having an average particle size of 2 μm had an average thickness of 0.08 μm and an aspect ratio of 25. The plate-like alumina having an average particle size of 5 μm had an average thickness of 0.07 μm and an aspect ratio of 70. The plate-like alumina having an average particle size of 7 μm had an average thickness of 0.1 μm and an aspect ratio of 70. Subsequently, drying was conducted with a rotary evaporator. The dried plate-like alumina-carbon mixture was slightly pulverized with a mortar. A carbon crucible was filled with 100 g of the mixture and placed in a high-temperature atmosphere furnace. While nitrogen was allowed to flow at a rate of 3 L/min, the temperature was increased to 1,600° C. at a temperature-increasing rate of 200° C./hr, and the crucible was held at the temperature for 20 hours. After the completion of the reaction, natural cooling was performed, and a sample was removed from the crucible. In order to remove remaining carbon, the sample was further heat-treated at 650° C. for 10 hours in an oxidizing atmosphere using a muffle furnace. Thus, a plate-like AlN powder was obtained.

In Experimental Examples 1 to 36, plate-like AlN powders having various average particle sizes, average thicknesses, and aspect ratios were used. These plate-like AlN powders were produced by preparing plate-like alumina powders having different shapes, and nitriding the plate-like alumina powders. The plate-like alumina powders having different shapes were prepared as described below. First, gibbsite aluminum hydroxide was subjected to wet pulverization to adjust the average particle size to 0.4 to Orthophosphoric acid was added in an amount of $1.0 \times 10^{-5}$ to $1.0 \times 10^{-2}$ moles relative to one mole of aluminum hydroxide to form a slurry. An increase in the average particle size of aluminum hydroxide increases the average particle size of alumina. An increase in the amount of orthophosphoric acid added increases the aspect ratio. The resulting slurry was granulated and dried at a drying temperature of 140° C. by using a spray dryer (Model: FL-12, available from Ohkawara Kakohki Co., Ltd.), so that the content of water in the raw material was less than 1% by weight. The resulting powder was formed into a 50 wt % aqueous slurry and then subjected to hydrothermal synthesis at a synthesis temperature of 600° C. and a pressure of 15 MPa. After the hydrothermal synthesis, the resulting product was washed with water and dried to obtain white alumina particles. The particle size of alumina can be decreased without changing the aspect ratio by adding a part of the orthophosphoric acid to water used for the hydrothermal synthesis without adding the part of the orthophosphoric acid in the formation of the slurry.

Figure 2:
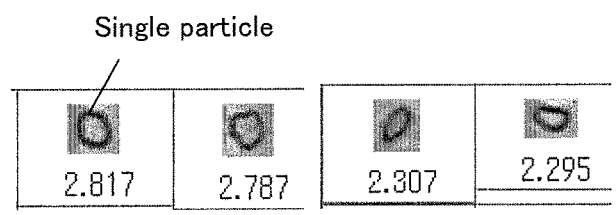
FIG. 2 includes photographs each showing an image of a single particle of a plate-like AlN powder.
Figure 3:
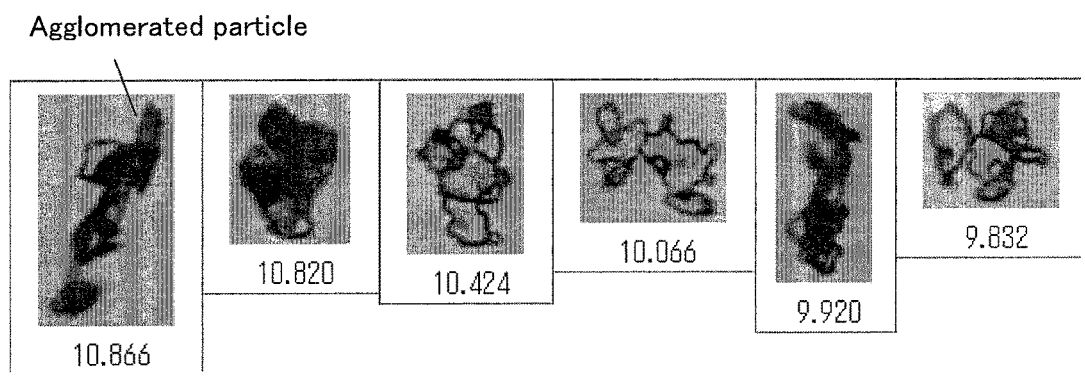
FIG. 3 includes photographs each showing an image of an agglomerated particle of a plate-like AlN powder.
Figure 4:
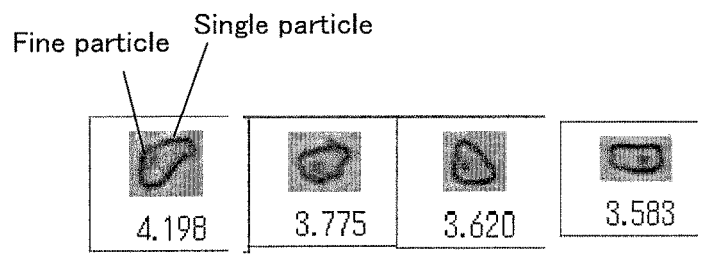
FIG. 4 includes photographs each showing an image of a particle that includes a single particle of a plate-like AlN powder and a fine particle adhering to the single particle.

Since the plate-like AlN powder prepared above included single particles and agglomerated particles, the single particles were selected by performing disintegration and classification. Specifically, 100 g of the prepared plate-like AlN powder, 300 g of alumina balls having a diameter ϕ of 15 mm, and 60 mL of IPA (TOKUSO IPA, available from Tokuyama Corporation) were put in a poly-pot container, and disintegration was conducted at 30 rpm for 240 minutes. Subsequently, drying was conducted with a rotary evaporator. The dried plate-like AlN powder was classified with a precise air classifier (model number: TC-15NSC) available from Nisshin Engineering Inc. The classification point was set to the same size as the average particle size, and fine particles after classification were used as the raw material. An image of the finally obtained plate-like AlN powder was observed with a wet flow-type particle size/shape analyzer (FPIA-3000S, available from Sysmex Corporation), and it was confirmed that the plate-like AlN powder was formed of single particles. FIGS. 2 to 4 show an example of images of an AlN powder, the images being obtained by this analyzer. FIG. 2 includes images of a single particle, FIG. 3 includes images of an agglomerated particle, and FIG. 4 includes images of a particle that includes a single particle and a fine particle adhering to the single particle. The numerical values indicated under the images each represents a length of the plate surface in the long-axis direction, that is, a particle size (μm). Herein, a particle that includes a single particle and a fine particle adhering to the single particle was also considered as a single particle. Note that the average particle size and the average thickness of the plate-like AlN powder were considered to be the same as those of the plate-like alumina powder used.

(2) Synthesis of Sintering Aid (Ca—Al—O-Based Aid)

C3A was synthesized as described below. First, 56 g of calcium carbonate (Silver-W, available from Shiraishi Calcium Kaisha, Ltd.), 19 g of γ-alumina (TM-300D, available from Taimei Chemicals Co., Ltd.), 1,000 g of 015 mm alumina balls, and 125 mL of IPA (TOKUSO IPA, available from Tokuyama Corporation) were put in a poly-pot container, and pulverization and mixing were conducted at 110 rpm for 120 minutes. Subsequently, drying was conducted with a rotary evaporator to prepare a mixed powder. An alumina crucible was filled with 70 g of this mixed powder and placed in an air atmosphere furnace. The temperature was increased to 1,250° C. at a temperature-increasing rate of 200° C./hr, and the crucible was held at the temperature for 3 hours. After the completion of the reaction, natural cooling was performed, and a sample was removed from the crucible. C2A was synthesized in the same manner as described above by using 47 g of calcium carbonate and 24 g of alumina to prepare an aid formed from C3A and C12A7. C4A was synthesized by mixing 40 g of C3A and 15 g of $CaCO_3$. A ratio $CaO/Al_2O_3$ (molar ratio) of C3A, C2A, and C4A are 3, 2, and 4, respectively.

(3) Blending of Mixed Powder

The plate-like AlN powder obtained in (1) above, a commercially available spherical AlN powder (F-Grade, average particle size: 1.2 μm, available from Tokuyama Corporation), and the Ca—Al—O-based aid obtained in (2) above were weighed in the mass ratio shown in Table 1 and Table 2 so that the total weight was 20 g. These were put in a poly-pot container together with 300 g of alumina balls having a diameter ϕ of 15 mm and 60 mL of IPA (TOKUSO IPA, available from Tokuyama Corporation), and pulverization and mixing were conducted were conducted at 30 rpm for 240 minutes. Subsequently, drying was conducted with a rotary evaporator to prepare a mixed powder.

(4) Preparation of Multilayer Formed Body

To 100 parts by mass of the mixed powder prepared in (3) above, 7.8 parts by mass of polyvinyl butyral (product number: BM-2, available from Sekisui Chemical Co., Ltd.)

serving as a binder, 3.9 parts by mass of di(2-ethylhexyl) phthalate (available from Kurogane Kasei Co., Ltd.) serving as a plasticizer, 2 parts by mass of sorbitan trioleate (RHEODOL SP-030, available from Kao Corporation) serving as a dispersant, and 2-ethylhexanol serving as a dispersion medium were added, the resulting mixture was mixed. The amount of the dispersion medium was adjusted such that the resulting slurry had a viscosity of 20,000 cp. A tape cast body was prepared by using the slurry prepared in this manner. Specifically, the slurry was cast by a doctor blade method on a PET film to form a sheet-like tape cast body having a dry thickness of 100 µm such that the plate surface (c-plane) of the plate-like AlN powder was arranged along the surface of the tape cast body. The resulting tape cast body was cut into circular pieces each having a diameter of 20 mm. Subsequently, 40 circular pieces were stacked. The resulting stacked body was placed on an Al plate having a thickness of 10 mm and then placed in a package. The package was evacuated to prepare a vacuum package. The vacuum package was isostatically pressed in hot water at 85° C. at a pressure of 100 kgf/cm² to prepare a disk-shaped multilayer formed body.

(5) Hot-Press Sintering

The multilayer formed body obtained in (4) above was placed in a degreasing furnace and degreased at 600° C. for 10 hours. In Experimental Examples 1 to 15 and 17 to 36, sintering was performed under the sintering conditions shown in Tables 1 and 2 to obtain AlN sintered bodies. Specifically, degreased bodies were sintered by hot-pressing in nitrogen using a graphite mold at a sintering temperature (maximum attained temperature) of 1,800° C. to 1,900° C. for 2 to 10 hours at a surface pressure of 200 kgf/cm² to obtain AlN sintered bodies. The direction in which the pressure was applied during hot-pressing was a stacking direction of the multilayer formed body (a direction substantially perpendicular to the surface of the tape cast body). When the temperature was decreased from the sintering temperature, the pressure during pressing was maintained until the temperature reaches room temperature. In Experimental Example 16, the resulting degreased body was sintered in nitrogen at atmospheric pressure at a sintering temperature (maximum attained temperature) of 1,880° C. for 5 hours to obtain an AlN sintered body.

2. Evaluation Method (1) Degree of c-Plane Orientation of Formed Body

To examine the degree of orientation of the AlN multilayer formed body prepared above, the disk-shaped AlN multilayer formed body was placed in an XRD apparatus so as to be parallel to the upper surface of the AlN multilayer formed body, and the upper surface was irradiated with X-rays to measure the degree of c-plane orientation. An XRD profile was measured with the XRD apparatus (RINT-TTR III, available from Rigaku Corporation) in a 2θ range of 20° to 70°. Specifically, the measurement was performed using CuKα radiation at a voltage of 50 kV and a current of 300 mA. The degree of c-plane orientation f (%) was calculated by the Lotgering method. Specifically, the degree of c-plane orientation was calculated by formulae described below. In the formulae, P represents a value obtained from the XRD profile of the AlN multilayer formed body, and $P_0$ represents a value calculated from reference AlN (JCPDS card No. 076-0566). Note that (100), (002), (101), (102), (110), and (103) were used as (hkl).

$f=\{(P-P_0)/(1-P_0)\}\times 100$ $P_0=\Sigma I_0(002)/\Sigma I_0(hkl)$ $P=\Sigma I(002)/\Sigma I(hkl)$ (2) Amount of Impurity Metals and Amount of Oxygen of AlN Sintered Body The amount of impurity metals was analyzed by a method of decomposition with sulfuric acid in a pressurized vessel in accordance with JIS R1649 using an inductively coupled plasma (ICP) emission spectrometer (PS3520UV-DD, available from Hitachi High-Technologies Corporation). Here, the measurement was performed for Si, Fe, Ti, Ca, Mg, K, Na, P, Cr, Mn, Ni, Zn, Ga, Y, and Zr as the impurity metals. The amount of oxygen was measured by an inert gas fusion-infrared absorption spectroscopy in accordance with JIS R1675 (methods for chemical analysis of fine AlN powders for fine ceramics).

(3) Measurement of Relative Density of AlN Sintered Body

The bulk density was measured in accordance with JIS R1634 (test methods for density and open porosity of sintered bodies of fine ceramics), and the relative density was calculated on the assumption that the theoretical density is 3.260.

(4) Degree of c-Plane Orientation of AlN Sintered Body

To examine the degree of orientation of the AlN sintered body prepared above, the disk-shaped AlN sintered body was polished so as to be parallel to the upper surface of the AlN sintered body, and the polished surface was then irradiated with X-rays to measure the degree of c-plane orientation. An XRD profile was measured with an XRD apparatus (RINT-TTR III, available from Rigaku Corporation) in a 2θ range of 20° to 70°. Specifically, the measurement was performed using CuKα radiation at a voltage of 50 kV and a current of 300 mA. The degree of c-plane orientation f (%) was calculated by the Lotgering method. Specifically, the degree of c-plane orientation was calculated by formulae described below. In the formulae, P represents a value obtained from the XRD profile of the AlN sintered body, and $P_0$ represents a value calculated from reference AlN (JCPDS card No. 076-0566). Note that (100), (002), (101), (102), (110), and (103) were used as (hkl).

$f=\{(P-P_0)/(1-P_0)\}\times 100$ $P_0=\Sigma I_0(002)/\Sigma I_0(hkl)$ $P=\Sigma I(002)/\Sigma I(hkl)$ (5) Observation of Cross Section of AlN Sintered Body An arbitrary cross section of the AlN sintered body prepared above was preliminary polished with a diamond abrasive and then polished with a cross-section polisher (CP) (SM-09010, available from JEOL, Ltd). The CP falls under the category of ion milling. A backscattered electron image of the resulting cross section was taken with a scanning electron microscope (JSM-6390, available from JEOL, Ltd.) at a magnification of 2,000.

(6) Corrosion Resistance Test

First, a sample was polished. Specifically, polishing was performed at a polishing pressure of 180 g/cm² for a polishing time of 20 minutes by using a buff to which a 9-µm diamond was applied. Subsequently, polishing was performed at a polishing pressure of 180 g/cm² for a polishing time of 20 minutes by using a buff to which a 3-µm diamond was applied. After the polishing, a part of the polished surface was masked, and the resulting sample was exposed to a corrosive environment to perform a corrosion resistance test. Specifically, nitrogen fluoride ($NF_3$) was supplied as a corrosive gas at a flow rate of 75 sccm (standard cm³/min), a radio-frequency (RF) voltage of 800 W was applied to generate plasma, and the sample was maintained in the high-temperature corrosive environment at 600° C. for 5 hours. No bias was applied. After the corrosion resistance test, a surface roughness (Rmax) was measured with a surface roughness meter. An Rmax before the corrosion resistance test was 0.5 µm. The corrosion resistance was evaluated on a scale of four levels A to D described below.

A: Rmax is 1 µm or less.
B: Rmax is more than 1 µm and 1.5 µm or less.
C: Rmax is more than 1.5 µm and 2 µm or less.
D: Rmax is more than 2 µm.

3. Results and Evaluation

Table 1 and Table 2 show evaluation results of the AlN sintered bodies of Experimental Examples. Each of the AlN sintered bodies obtained in Experimental Examples 1 to 15, 17, 18, 23, 25 to 28, and 30 to 36 had a high degree of c-plane orientation of 70% or more and had good plasma resistance (corrosion resistance). In contrast, in Experimental Example 16, the degree of c-plane orientation was 44%, which was not sufficiently high, because normal-pressure sintering was conducted instead of hot-press sintering. In Experimental Examples 19 to 21, and 29, sufficient corrosion resistance was not obtained because the average thickness exceeded 1.8 µm. In Experimental Examples 22 and 24, the degrees of c-plane orientation were low, namely, 10% and 40%, respectively, and sufficient corrosion resistance was not obtained because the plate-like AlN powders used had an aspect ratio of less than 3.

The AlN sintered bodies obtained in Experimental Examples 1 to 15, 17, 18, 23, 25 to 28, and 30 to 36 are useful as materials of members for which plasma resistance is required, such as members for semiconductor manufacturing apparatuses, and materials of members for which high piezoelectric properties are required, such as sensors for high temperatures. In Experimental Examples 1 to 15, 17, 18, 23, 25 to 28, and 30 to 36, hot-press sintering is used without using a rotating magnetic field, which is used in NPL 1. Thus, an AlN sintered body having a high degree of c-plane orientation can be produced at a low cost compared with the case where a rotating magnetic field is used.

Figure 5:
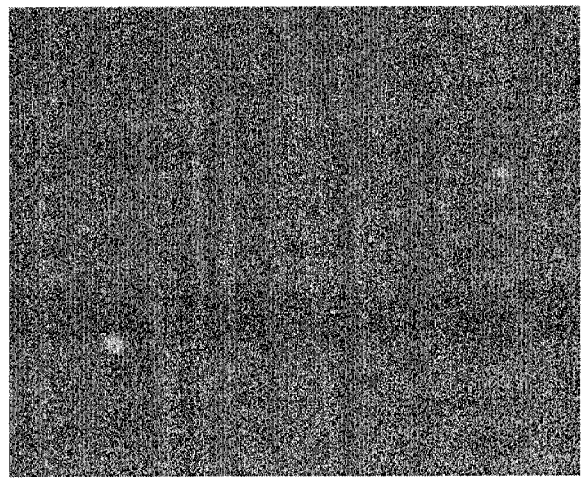
FIG. 5 is a photograph of a backscattered electron image of a cross section of an AlN sintered body.

FIG. 5 shows a photograph of a backscattered electron image of Experimental Example 3. In FIG. 5, the blackish region is AlN, and the (two) white spots are each a Ca—Al-based oxide (where Ca is a component derived from the sintering aid) contained in a grain boundary phase between AlN sintered grains. Since the average atomic weight of the Ca—Al-based oxide is higher than that of AlN, the Ca—Al-based oxide appears brighter than AlN. Therefore, the Ca—Al-based oxide can be easily distinguished by visual observation. Similar photographs of backscattered electron images were obtained in other Experimental Examples (except for Experimental Example 16).

Experimental Examples 1 to 15, 17, 18, 23, 25 to 28, and 30 to 36 correspond to Examples of the present invention, and Experimental Examples 16, 19 to 22, 24, and 29 correspond to Comparative Examples. These Experimental Examples do not limit the present invention.

The present application claims priority from Japanese Patent Application No. 2016-247873 filed Dec. 21, 2016 and International Application No. PCT/JP2017/025084 filed Jul. 10, 2017, the entire contents of which are incorporated herein by reference.

What is claimed is:

1. A method for producing an oriented AlN sintered body, comprising:
    a first step of preparing a formed body by forming a mixture obtained by mixing a sintering aid with an AlN raw-material powder containing a plate-like AlN powder whose plate surface is a c-plane and which has an aspect ratio of 3 or more and an average thickness of 0.05 to 1.8 µm, wherein the mixture is formed such that the plate surface of the plate-like AlN powder is disposed along a surface of the formed body; and
    a second step of obtaining an oriented AlN sintered body by subjecting the formed body to hot-press sintering in a non-oxidizing atmosphere while applying a pressure to the surface of the formed body,
    wherein the oriented AlN sintered body includes a grain boundary phase that contains a component derived from a sintering aid is present between AlN sintered grains, a degree of c-plane orientation is 70% or more as determined by a Lotgering method, and a relative density is 98.6% or more.

2. The method for producing an oriented AlN sintered body according to claim 1,
    wherein in the first step, particles contained in the plate-like AlN powder do not agglomerate and are separated from each other.

3. The method for producing an oriented AlN sintered body according to claim 1,
    wherein in the first step, a plurality of tape cast bodies each obtained by forming the mixture into a sheet are stacked to prepare a multilayer formed body, and
    in the second step, the multilayer formed body is subjected to hot-press sintering.

4. The method for producing an oriented AlN sintered body according to claim 1,
    wherein the AlN raw-material powder contains a spherical AlN powder besides the plate-like AlN powder.

5. The method for producing an oriented AlN sintered body according to claim 1,
    wherein the sintering aid is a complex oxide of Ca and Al or a rare-earth oxide.

6. The method for producing an oriented AlN sintered body according to claim 1,
    wherein the plate-like AlN powder has an average particle size of 2 to 20 µm.

7. An oriented AlN sintered body having a polycrystalline structure, wherein a grain boundary phase that contains a component derived from a sintering aid is present between AlN sintered grains, a degree of c-plane orientation is 70% or more as determined by a Lotgering method, and a relative density is 98.6% or more.

8. The oriented AlN sintered body according to claim 7, wherein the sintering aid is a complex oxide of Ca and Al or a rare-earth oxide.

9. The oriented AlN sintered body according to claim 7, wherein the degree of c-plane orientation is 95% or more.

10. The oriented AlN sintered body according to claim 7, wherein the relative density is 99.1% or more.

* * * * *